(12) United States Patent
Yoon et al.

(10) Patent No.: US 11,171,291 B2
(45) Date of Patent: Nov. 9, 2021

(54) ELECTROLUMINESCENT DEVICE, AND DISPLAY DEVICE COMPRISING THEREOF

(71) Applicant: Samsung Electronics Co., Ltd., Suwon-si (KR)

(72) Inventors: Won Sik Yoon, Seoul (KR); Moon Gyu Han, Suwon-si (KR); Tae Ho Kim, Seongnam-si (KR); Eun Joo Jang, Suwon-si (KR); Hongkyu Seo, Anyang-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 288 days.

(21) Appl. No.: 16/372,861

(22) Filed: Apr. 2, 2019

(65) Prior Publication Data

US 2020/0161551 A1    May 21, 2020

(30) Foreign Application Priority Data

Nov. 21, 2018 (KR) .......................... 10-2018-0144789

(51) Int. Cl.
*H01L 51/50* (2006.01)
*H01L 51/00* (2006.01)
(Continued)

(52) U.S. Cl.
CPC ........ *H01L 51/005* (2013.01); *H01L 51/0037* (2013.01); *H01L 51/0039* (2013.01);
(Continued)

(58) Field of Classification Search
None
See application file for complete search history.

(56) References Cited

U.S. PATENT DOCUMENTS

| 9,761,822 | B2 | 9/2017 | Kim |
| 9,978,972 | B2 | 5/2018 | Xu |

(Continued)

FOREIGN PATENT DOCUMENTS

| JP | 6168372 | B2 | 7/2017 | |
| KR | 2017093506 | * | 8/2017 | ............. H01L 51/50 |

OTHER PUBLICATIONS

Jia et al., Triazine-phosphine oxide electron transporter for ultralow-voltage-driven sky blue PHOLEDs; Journal of Materials Chemistry C: Materials for Optical and Electronic Devices (2015), 3(19), 4890-4902 (Year: 2015).*

(Continued)

*Primary Examiner* — Gregory D Clark
(74) *Attorney, Agent, or Firm* — Cantor Colburn LLP

(57) ABSTRACT

An electroluminescent device and including a first electrode and a second electrode facing each other; an emission layer disposed between the first electrode and the second electrode, wherein the emission layer includes a quantum dot and a first electron transporting material represented by Chemical Formula 1; a hole transport layer disposed between the emission layer and the first electrode; and an electron transport layer disposed between the emission layer and the second electrode:

(Continued)

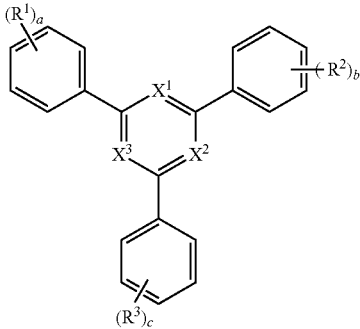

Chemical Formula 1 wherein, the definitions of groups and variables in Chemical Formula 1 are the same as described in the specification.

19 Claims, 6 Drawing Sheets

(51) Int. Cl.
*H01L 51/56* (2006.01)
*H01L 51/52* (2006.01)

(52) U.S. Cl.
CPC ...... *H01L 51/0003* (2013.01); *H01L 51/0021* (2013.01); *H01L 51/0026* (2013.01); *H01L 51/502* (2013.01); *H01L 51/508* (2013.01); *H01L 51/5056* (2013.01); *H01L 51/5088* (2013.01); *H01L 51/5206* (2013.01); *H01L 51/5221* (2013.01); *H01L 51/56* (2013.01); *H01L 2251/301* (2013.01); *H01L 2251/308* (2013.01); *H01L 2251/558* (2013.01)

(56) References Cited

U.S. PATENT DOCUMENTS

| | | | |
|---|---|---|---|
| 2005/0253508 A1* | 11/2005 | Okano | H01L 51/5228 313/506 |
| 2007/0099025 A1* | 5/2007 | Oshiyama | C09K 11/06 428/690 |
| 2009/0085473 A1* | 4/2009 | Ilzumi | B82Y 30/00 313/504 |
| 2010/0308754 A1 | 12/2010 | Gough et al. | |
| 2012/0256536 A1* | 10/2012 | Terashima | C07F 9/58 313/506 |
| 2013/0063023 A1 | 3/2013 | Pan et al. | |
| 2013/0214249 A1 | 8/2013 | Pan et al. | |
| 2013/0226268 A1 | 8/2013 | Pan | |
| 2016/0240730 A1 | 8/2016 | Murayama et al. | |
| 2017/0133614 A1* | 5/2017 | Gu | H01L 51/5088 |

OTHER PUBLICATIONS

Gong et al., High-Power-Efficiency Blue Electrophosphorescence Enabled by the Synergistic Combination of Phosphine-Oxide-Based Host and Electron-Transporting Materials, Chemistry of Materials (2014), 26(3), 1463-1470 (Year: 2014).*

Gong et al., High-Power-Efficiency Blue Electrophosphorescence Enabled by the Synergistic Combination of Phosphine-Oxide-Based Host and Electron-Transporting Materials Chem. Mater. 2014, 26, 1463-1470 (Year: 2014).*

Jia et al., Triazine-phosphine oxide electron transporter for ultralow-voltage-driven sky blue PHOLEDs†; J. Mater. Chem. C, 2015, 3, 4890-4902 (Year: 2015).*

* cited by examiner

ELECTROLUMINESCENT DEVICE, AND DISPLAY DEVICE COMPRISING THEREOF

CROSS-REFERENCE TO RELATED APPLICATION

This application claims priority to Korean Patent Application No. 10-2018-0144789 filed in the Korean Intellectual Property Office on Nov. 21, 2018, and all the benefits accruing therefrom under 35 U.S.C. § 119, the contents of which is incorporated herein in its entirety by reference.

BACKGROUND

1. Field

An electroluminescent device and a display device including the same are disclosed.

2. Description of the Related Art

Quantum dots are nanocrystal semiconductor materials having a diameter of less than or equal to around several to several hundreds of nanometers, which show quantum confinement effects. Quantum dots generate stronger light in a narrow wavelength region than commonly used phosphors. Quantum dots emit light while the excited electrons are transited from a conduction band to a valence band, and wavelengths are changed depending upon a particle size even in the same material. As quantum dots emit light a shorter wavelength in smaller particle sizes, they may obtain light in a desirable wavelength region by adjusting the sizes.

In other words, an emission layer including quantum dots and various types of electronic devices including the same may generally save production costs, compared with an organic light emitting diode using an emission layer including a phosphorescent and/or fluorescent material, and desirable colors may be emitted by changing sizes of quantum dots, needless to use other organic materials in the emission layer for emitting other color lights.

Luminous efficiency of the emission layer including quantum dots is determined by quantum efficiency of quantum dots, a balance of charge carriers, light extraction efficiency, and the like. Particularly, in order to improve the quantum efficiency, excitons may be confined in the emission layer, but when the excitons are not confined in the emission layer by a variety of factors, it may cause a problem such as exciton quenching.

There remains a need for an electroluminescent device that exhibits superior characteristics by improving electron transporting capability of the emission layer.

SUMMARY

An electroluminescent device which exhibits superior device characteristics by improving electron transporting capability of the emission layer, and a display device including the same are provided.

According to an embodiment, an electroluminescent device includes a first electrode and a second electrode facing each other; an emission layer disposed between the first electrode and the second electrode, wherein the emission layer includes a quantum dot and a first electron transporting material represented by Chemical Formula 1; a hole transport layer disposed between the emission layer and the first electrode; and an electron transport layer disposed between the emission layer and the second electrode.

Chemical Formula 1

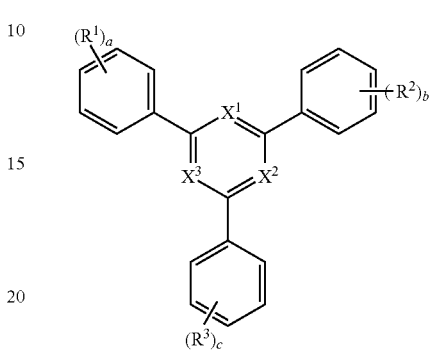

In Chemical Formula 1, $X^1$ to $X^3$ are independently selected from —C(—$R^a$)— and —N—, wherein $R^a$ is selected from hydrogen, a substituted or unsubstituted C4 to C20 alkyl group, a substituted or unsubstituted C3 to C20 cycloalkyl group, a substituted or unsubstituted C6 to C20 aryl group, a substituted or unsubstituted C3 to C20 heteroaryl group, $R^1$ to $R^3$ are independently selected from hydrogen, a halogen atom, —P(=O)$R^4R^5$, —PO$_2R^6$, —SO$_2R^7$, —C(=O)$R^8$, and —C(=O)O$R^9$, wherein at least one selected from $R^1$ to $R^3$ is selected from —P(=O)$R^4R^5$ and —PO$_2R^6$, wherein $R^4$ to $R^9$ are independently selected from hydrogen, a halogen atom, a hydroxy group, a nitro group, a cyano group, an amino group, an azido group, an amidino group, a hydrazino group, a hydrazono group, a carbamoyl group, a thiol group, a carboxyl group, a sulfonic acid group, a phosphoric acid, a vinyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C6 to C30 allyl group, a substituted or unsubstituted C1 to C30 alkoxy group, a substituted or unsubstituted C1 to C30 heteroalkyl group, a substituted or unsubstituted C3 to C30 heteroaryl group, a substituted or unsubstituted C3 to C30 cycloalkyl group, a substituted or unsubstituted C3 to C15 cycloalkenyl group, a substituted or unsubstituted C6 to C15 cycloalkynyl group, and a substituted or unsubstituted C3 to C30 heterocycloalkyl group, and a, b, and c are independently integers ranging from 1 to 5.

At least one selected from $R^1$ to $R^3$ may be P(=O)$R^4R^5$, wherein $R^4$ and $R^5$ may independently be selected from hydrogen, a halogen atom, a substituted or unsubstituted C1 to C30 alkyl group, a substituted or unsubstituted C1 to C30 heteroalkyl group, a substituted or unsubstituted C6 to C30 aryl group, a substituted or unsubstituted C7 to C30 arylalkyl group, and a substituted or unsubstituted C3 to C30 heteroaryl group.

The first electron transporting material may be represented by Chemical Formula 2.

Chemical Formula 2

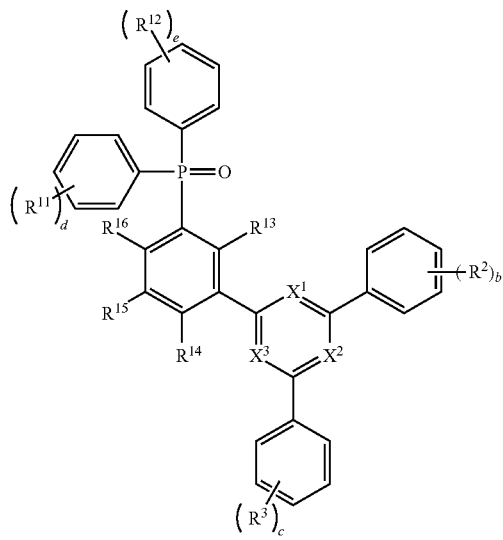

Chemical Formula 3

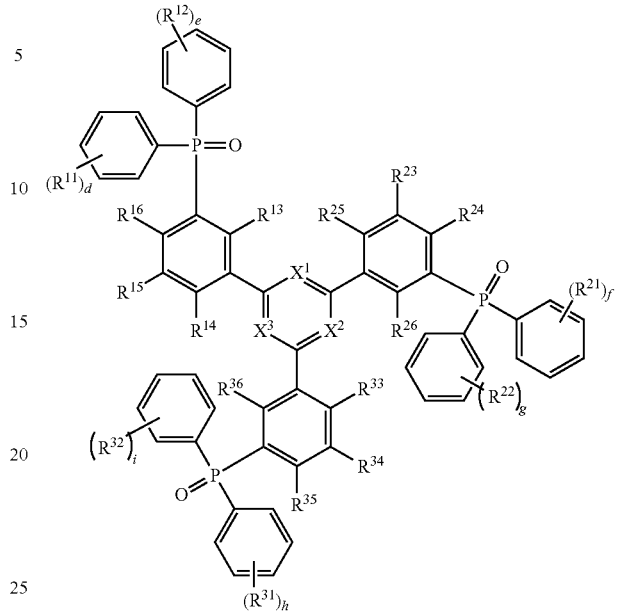

In Chemical Formula 2, $X^1$ to $X^3$, $R^2$, and $R^3$ are the same as defined in claim 1, $R^{11}$ to $R^{16}$ are independently selected from hydrogen, a substituted or unsubstituted C4 to C20 alkyl group, a substituted or unsubstituted C3 to C20 cycloalkyl group, a substituted or unsubstituted C6 to C20 aryl group, a substituted or unsubstituted C3 to C20 heteroaryl group, a substituted or unsubstituted alkylamine group, and a substituted or unsubstituted arylamine group, and b, c, d, and e are independently integers ranging from 1 to 5.

At least one selected from $R^2$ to $R^3$ may be $P(=O)R^4R^5$, wherein $R^4$ and $R^5$ are independently selected from hydrogen, a halogen atom, a substituted or unsubstituted C1 to C30 alkyl group, a substituted or unsubstituted C1 to C30 heteroalkyl group, a substituted or unsubstituted C6 to C30 aryl group, a substituted or unsubstituted C7 to C30 arylalkyl group, and a substituted or unsubstituted C3 to C30 heteroaryl group.

Both $R^2$ and $R^3$ may be $P(=O)R^4R^5$, wherein $R^4$ and $R^5$ are independently selected from hydrogen, a halogen atom, a substituted or unsubstituted C1 to C30 alkyl group, a substituted or unsubstituted C1 to C30 heteroalkyl group, a substituted or unsubstituted C6 to C30 aryl group, a substituted or unsubstituted C7 to C30 arylalkyl group, and a substituted or unsubstituted C3 to C30 heteroaryl group.

The first electron transporting material may be represented by Chemical Formula 3.

In Chemical Formula 3, $X^1$ to $X^3$ may each be $—C(—R^a)—$ or may each be $—N—$, wherein $R^a$ is selected from hydrogen, a substituted or unsubstituted C4 to C20 alkyl group, a substituted or unsubstituted C3 to C20 cycloalkyl group, a substituted or unsubstituted C6 to C20 aryl group, and a substituted or unsubstituted C3 to C20 heteroaryl group, $R^{11}$ to $R^{16}$, $R^{21}$ to $R^{26}$ and $R^{31}$ to $R^{36}$ are independently selected from hydrogen, a substituted or unsubstituted C4 to C20 alkyl group, a substituted or unsubstituted C3 to C20 cycloalkyl group, a substituted or unsubstituted C6 to C20 aryl group, a substituted or unsubstituted C3 to C20 heteroaryl group, a substituted or unsubstituted alkylamine group, and a substituted or unsubstituted arylamine group, and d, e, f, g, h, and l are independently integers ranging from 1 to 5.

In an embodiment, $X^1$ to $X^3$ may each be $—C(—R^a)—$, wherein $R^a$ is hydrogen.

In another embodiment, $X^1$ to $X^3$ may each be $—N—$.

The first electron transporting material may be included in an amount of about 5 percent by weight to about 30 weight % based on a total amount, 100 weight % of the emission layer.

A polar ligand bound to a surface of the quantum dot may be further included.

The polar ligand may include a main chain including a C4 to C20 alkyl group, a C4 to C20 alkenyl group, a C4 to C20 alkynyl group, or a combination thereof; and a polar functional group selected from a hydroxy group, a carboxyl group, a thiol group, an amine group, a carbonyl group, and a phosphoric acid group which is bound to the main chain.

The polar functional group may include at least one hydroxy group.

The quantum dot may include a Group II-VI compound that does not include Cd, a Group III-V compound, a Group IV-VI compound, a Group IV element or compound, a Group compound, a Group I-II-IV-VI compound that does not include Cd, or a combination thereof.

The quantum dot may have a core-shell structure.

The electron transport layer may include a second electron transporting material that is different from the first electron transporting material.

The second electron transporting material may include 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, 8-hydroxyquinolinato lithium (LiQ), ET204 (8-(4-(4,6-di (naphthalen-2-yl)-1,3,5-triazin-2-yl)phenyl)quinolone), BPhen, ABH113, NET218, NET338, NET430, NDN77, NDN87, or a combination thereof.

The hole transport layer may include a poly(3,4-ethylenedioxythiophene) compound, a poly(styrenesulfonate) compound, a poly-N-vinylcarbazole compound, a polyphenylenevinylene compound, a polyparaphenylenevinylene compound, a polymethacrylate compound, a polyarylamine compound, a polyaniline compound, a polypyrrole compound, a poly(9,9-octylfluorene) compound, a poly(spirofluorene) compound, a poly-(N,N'-diphenyl-N,N'-bis(3-methylphenyl)-(1,1'-biphenyl)-4,4'-diamine), a poly[(9,9-dioctylfluorenyl-2,7-diyl-co(4,4'-(N-4-butylphenyl) diphenylamine], a poly((9,9-dioctylfluorene)-co-N,N-diphenyl-N,N-di-(p-butylphenyl)-1,4-diaminobenzene), NiO, $MoO_3$, or a combination thereof. The electroluminescent device may further include a hole injection layer disposed between the first electrode and the hole transport layer.

According to another embodiment, a display device includes the electroluminescent device according to the embodiment.

The electroluminescent device exhibiting improved device characteristics through improvement of the electron transporting capability of the emission layer, and a display device including the same are provided.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION

Figure 1:
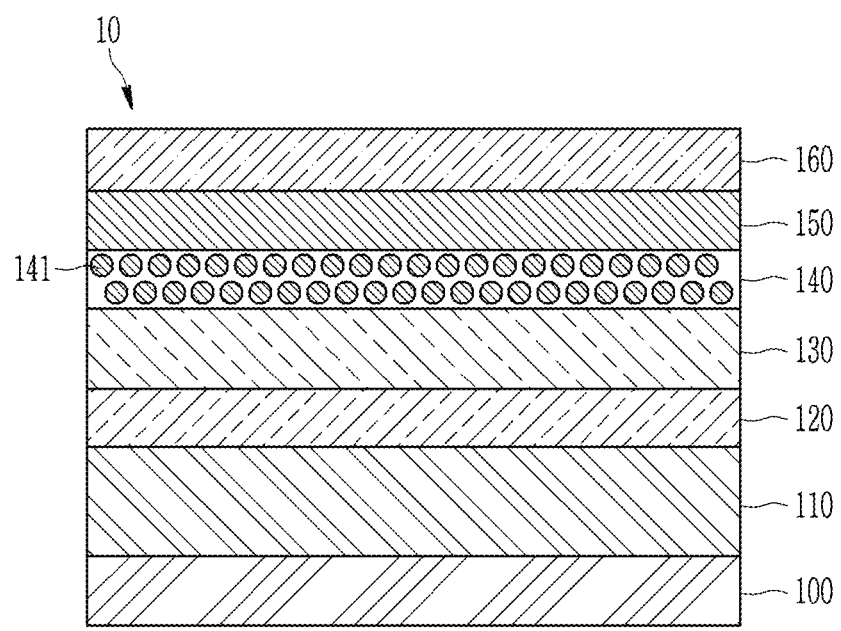
FIG. 1 is a schematic cross-sectional view of an electroluminescent device, according to an embodiment.

Example embodiments of the present disclosure will hereinafter be described in detail, and may be easily performed by a person having an ordinary skill in the related art. However, this disclosure may be embodied in many different forms, and is not to be construed as limited to the example embodiments set forth herein. Accordingly, the embodiments are merely described below, by referring to the figures, to explain aspects of the present description.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

As used herein, the term "alkyl group" refers to a straight or branched chain saturated aliphatic hydrocarbon group having the specified number of carbon atoms and having a valence of at least one. Non-limiting examples of the alkyl group are methyl, ethyl, and propyl.

As used herein, the term "alkoxy group" may refer to "alkyl-O—", wherein the term "alkyl" has the same meaning as described above.

As used herein, the term "alkyl group" refers to a straight or branched chain saturated aliphatic hydrocarbon group having the specified number of carbon atoms and including 1 or more heteroatoms selected from the group consisting of N, O, S, and P as chain atoms.

As used herein, the term "cycloalkyl group" may refer to a monovalent group having one or more saturated rings in which all ring members are carbon.

As used herein, the term "heterocycloalkyl group" may refer to a monovalent group having one or more saturated rings having the specified number of carbon atoms and including 1 to 3 heteroatoms selected from the group consisting of N, O, S, and P as ring atoms.

As used herein, the term "alkenyl group" may refer to a straight or branched chain, monovalent hydrocarbon group having at least one carbon-carbon double bond.

As used herein, the term "allyl group" may refer to an alkenyl group which includes the moiety "—$CH_2$—CH=$CH_2$".

As used herein, the term "alkynyl group" may refer to a straight or branched chain, monovalent hydrocarbon group having at least one carbon-carbon triple bond.

As used herein, the term "cycloalkenyl group" may refer to a monovalent group having one or more saturated rings in which all ring members are carbon, and having at least one carbon-carbon double bond.

As used herein, the term "cycloalkynyl group" may refer to a monovalent group having one or more saturated rings in which all ring members are carbon, and having at least one carbon-carbon triple bond.

As used herein, the term "aryl", which is used alone or in combination, may refer to an aromatic hydrocarbon containing at least one ring and having the specified number of carbon atoms. The term "aryl" may be construed as including a group with an aromatic ring fused to at least one cycloalkyl ring.

The term "heteroaryl group" may refer to an aryl group including carbon and 1 to 3 heteroatoms selected from the group consisting of N, O, S, and P as ring atoms.

The term "arylalkyl group" may refer to a substituted or unsubstituted aryl group covalently linked to an alkyl group that is linked to a compound.

As used herein, "Group" may refer to a group of Periodic Table.

As used herein, "Group II" may refer to Group IIA and Group IIB, and examples of Group II metal may be Cd, Zn, Hg, and Mg, but are not limited thereto.

As used herein, examples of "Group II metal that does not include Cd" may refer to a Group II metal except Cd, for example Zn, Hg, Mg, etc.

As used herein, "Group III" may refer to Group IIIA and Group IIIB, and examples of Group III metal may be Al, In, Ga, and TI, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group I" may refer to Group IA and Group IB, and examples may include Li, Na, K, Rb, and Cs, but are not limited thereto.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

As used herein, when a definition is not otherwise provided, "substituted" may refer to replacement of hydrogen of a compound by a to substituent selected from a halogen atom (F, Br, Cl, or I), a hydroxy group, nitro group, a cyano group, an amino group, an azido group, an amidino group, a hydrazino group, a hydrazono group, a carbonyl group, a carbamoyl group, a thiol group, an ester group, a carboxyl group or a salt thereof, a sulfonic acid group or a salt thereof, a phosphoric acid or a salt thereof, a vinyl group, a C1 to C20 alkyl group, a C2 to C20 alkenyl group, a C2 to C20 alkynyl group, a C6 to C30 aryl group, a C7 to C30 arylalkyl group, a C6 to C30 allyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

First, referring to FIG. 1, a schematic structure of an electroluminescent device, according to an embodiment is described.

FIG. 1 is a schematic cross-sectional view of an electroluminescent device, according to an embodiment.

According to an embodiment, an electroluminescent device 10 includes a first electrode 110 and a second electrode 160 facing each other and an emission layer 140 disposed therebetween, and including quantum dots 141 and a first electron transporting material having an electron transport capability, a hole transport layer 130 disposed between the emission layer 140 and the first electrode 110, an optional hole injection layer 120 disposed between the hole transport layer 130 and the first electrode 110, and an electron transport layer 150 disposed between the emission layer 140 and the second electrode 160.

In other words, the electroluminescent device 10 has a stack structure wherein the hole injection layer 120, the hole transport layer 130, the emission layer 140 and the electron transport layer 150 are disposed between the first electrode 110 and the second electrode 160 facing each other.

In an embodiment, the first electrode 110 may be directly connected to a driving power source so may function to flow current to the emission layer 140. The first electrode 110 may include a material having light transmittance in at least visible light wavelength region but is not limited thereto. The first electrode 110 may include a material having light transmittance in an infrared or ultraviolet (UV) wavelength region. For example, the first electrode 110 may be an optically transparent material.

In an embodiment, the first electrode 110 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

However, the first electrode 110, according to an embodiment, is not necessarily limited thereto, and may include a material further having light transmittance with respect to light in an infrared or ultraviolet (UV) wavelength region or a semi-permeable material selectively transmitting light in a particular wavelength region. The first electrode 110 may therefore conduct a function of reflecting light in a visible light wavelength region and turning it back toward the second electrode 160.

Meanwhile, in an embodiment, the first electrode 110 may be disposed on the substrate 100 as shown in FIG. 1. The substrate 100 may be a transparent insulating substrate or may be made of a ductile material. The substrate 100 may include glass or a polymer material in a film having a glass transition temperature ($T_g$) of greater than about 150° C. For example, it includes a COC (cyclo olefin copolymer) or COP (cyclo olefin polymer) based material.

In an embodiment, the substrate 100 may support the hole injection layer 120, the transport layer 130, the emission layer 140, and the electron transport layer 150 disposed between the first electrode 110 and the second electrode 160. However, the substrate 100 of the electroluminescent device 10, according to an embodiment, may not be disposed under the first electrode 110, but the substrate 100 may be disposed on the second electrode 160 or may be omitted, as needed.

The second electrode 160 includes an optically transparent material and may function as a light-transmitting electrode to transmit light generated in the emission layer 140. In an embodiment, the second electrode 160 may include at least one selected from silver (Ag), aluminum (Al), copper (Cu), gold (Au), and an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

However, the second electrode 160, according to an embodiment, is not necessarily limited thereto, and may include a semi-permeable material selectively transmitting light in a particular wavelength region and conduct a function of reflecting light in a visible light wavelength region and turning it back toward the first electrode 110.

When the second electrode 160 functions as a reflecting electrode, the first electrode 110 may be a light-transmitting electrode formed of a material transmitting light in at least visible light wavelength region or a semi-permeable electrode selectively transmitting light in a particular wavelength region.

Each of the first electrode 110 and the second electrode 160 may be formed by depositing a material for forming an electrode on the substrate 100 or an organic layer by a method such as sputtering.

On the other hand, as shown in FIG. 1, an electroluminescent device 10, according to an embodiment, may have a conventional structure wherein the substrate 100 and each of constituent elements are disposed in the above stack order.

However, the electroluminescent device 10, according to an embodiment, is not necessarily limited thereto, and may have various structures within a range of satisfying the aforementioned order of disposing each constituent element. For example, when the substrate 100 is disposed not beneath the first electrode 110 but on the second electrode 160, the electroluminescent device 10 may have an inverted structure.

The hole injection layer 120 may be disposed directly on the first electrode 110. The hole injection layer 120 may supply holes into the emission layer 140 together with the hole transport layer 130. However, the hole injection layer 120 may be omitted in consideration of the thickness and the material of the hole transport layer 130.

The hole injection layer 120 may be formed of a p-type semiconductor material or a material doped with a p-type dopant. The hole injection layer 120 may include a PEDOT [poly(3,4-ethylenedioxythiophene)] compound, a PSS [poly(styrene sulfonate)] compound, a poly-N-vinylcarbazole (PVK) compound, a polyphenylenevinylene compound, a poly p-phenylene vinylene (PPV) compound, a polymethacrylate compound, a poly(9,9-octylfluorene) compound, a poly(spiro-fluorene) compound, TCTA (tris(4-carbazol-9-yl phenyl)amine), TPD (N,N'-diphenyl-N,N'-bis(3-methylphenyl)-(1,1'-biphenyl)-4,4'-diamine), NPB (N,N'-di(naphthalen-1-yl)-N—N'-diphenyl-benzidine), m-MTDATA (tris(3-methylphenylphenylamino)-triphenylamine), TFB (poly[(9,9-dioctylfluorenyl-2,7-diyl-co(4,4'-(N-4-butylphenyl) diphenylamine], PFB (poly(9,9-dioctylfluorene)-co-N,N-diphenyl-N,N-di-(p-butylphenyl)-1,4-diaminobenzene), poly-TPD, a metal oxide such as NiO and $MoO_3$, or a combination thereof but is not limited thereto.

The hole transport layer 130 may be disposed on the first electrode 110, for example on the first electrode 110 and the hole injection layer 120. The hole transport layer 130 may provide and transport holes into the emission layer 140. The hole transport layer 130 may be formed directly under the emission layer 140 and directly contacts the emission layer 140.

On the other hand, the hole transport layer 130 may be a p-type semiconductor material, or a material doped with a p-type dopant, like the hole injection layer 120. Examples of the hole transport layer 130 may be a poly(3,4-ethylenedioxythiophene) compound, a poly(styrenesulfonate) compound, a poly-N-vinylcarbazole compound, a polyphenylenevinylene compound, a polyparaphenylenevinylene compound, a polymethacrylate compound, a polyarylamine compound, a polyaniline compound, a polypyrrole compound, a poly (9,9-octylfluorene) compound, a poly(spiro-fluorene) compound, TCTA (tris (4-carbazolyl-9-ylphenyl) amine), TPD (N,N'-diphenyl-N,N'-bis(3-methylphenyl)-(1,1'-biphenyl)-4,4'-diamine), NPB (N,N'-di(naphthalen-1-yl)-N—N'-diphenyl-benzidine), m-MTDATA (tris(3-methylphenylphenylamino)-triphenylamine), TFB (poly[(9,9-dioctylfluorenyl-2,7-diyl-co(4,4'-(N-4-butylphenyl) diphenylamine]), PFB (poly(9,9-dioctylfluorene)-co-N,N-diphenyl-N,N-di-(p-butylphenyl)-1,4-diaminobenzene), poly-TPD, NiO, $MoO_3$, or a combination thereof, but is not limited thereto.

The hole injection layer 120 and the hole transport layer 130 may be formed using a wet coating method such as spin coating. For example, both the hole transport layer 130 and the emission layer 140 may be formed using a wet coating method. Accordingly, the hole injection layer 120 and/or the hole transport layer 130 may be formed on the first electrode 110 by a simple method.

In an embodiment, the emission layer 140 may be disposed on the hole transport layer 130 and the quantum dots 141 and the first hole transporting material may be included.

The emission layer 140 is a site where electrons and holes transported by a current supplied from the first electrode 110 and the second electrode 160. The electrons and holes are combined in the emission layer 140 to generate excitons, and the generated excitons are transited from an exited state to a ground state to emit light in a wavelength corresponding to the size of the quantum dots 141. That is, the quantum dots 141 may endow the emission layer 140 with an electroluminescence function.

Particularly, the quantum dots 141 have a discontinuous energy bandgap by the quantum confinement effect and incident light may be converted into light having a particular wavelength and then radiated. Accordingly, the emission layer 140 including the quantum dots 141 may produce light having excellent color reproducibility and color purity.

For example, the emission layer 140 may emit light in a predetermined wavelength region. The predetermined wavelength region belongs to a visible light region, for example, a first wavelength region of about 380 nanometers (nm) to about 488 nm, a second wavelength region of about 490 nm to about 510 nm, a third wavelength region of greater than 510 nm to less than or equal to about 580 nm, a fourth wavelength region of about 582 nm to about 600 nm, or a fifth wavelength region of about 620 nm to about 680 nm.

In an embodiment, materials of the quantum dots 141 are not particularly limited and known or commercially available quantum dots may be used. For example, each of the quantum dots 141, according to an embodiment, may include a Group II-VI compound that does not include Cd, a Group III-V compound, a Group IV-VI compound, a Group IV element or compound, a Group compound, a Group I-II-IV-VI compound that does not include Cd, or a combination thereof. That is, each of the quantum dots 141, according to an embodiment, may be a non-cadmium-based quantum dot. When the quantum dots 141 exclude cadmium-based materials, they have no toxicity compared with a conventional cadmium-based quantum dots, and thus, are not dangerous and is environmentally-friendly.

The Group II-VI compound may be selected from a binary element compound selected from ZnS, ZnSe, ZnTe, ZnO, HgS, HgSe, HgTe, MgSe, MgS, and a mixture thereof; a ternary element compound selected from ZnSeS, ZnTe, ZnTeSe, HgSeS, HgSeTe, HgSTe, HgZnS, HgZnSe, HgZnTe, MgZnSe, MgZnS, and a mixture thereof; and a quaternary element compound selected from ZnTeSeS, HgZnTeS, HgZnSeS, HgZnSeTe, HgZnSTe, and a mixture thereof. The Group II-VI compound may further include a Group III metal.

The Group III-V compound may be selected from a binary element compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, InZnP, and a mixture thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal (InZnP).

The Group IV-VI compound may be selected from a binary element compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof. Examples of the Group I-III-VI compound may be $CuInSe_2$, $CuInS_2$, CuInGaSe, and CuInGaS, are not limited thereto. Examples of the Group I-II-IV-VI compound may be CuZnSnSe and CuZnSnS, are not limited thereto. Examples of the Group IV compound may be a single substance selected from Si, Ge, and a mixture thereof; and a binary element compound selected from SiC, SiGe, and a mixture thereof.

The binary element compound, the ternary element compound, or the quaternary element compound may be respectively present in a uniform concentration in the particle or in partially different concentrations in the same particle.

According to an embodiment, the quantum dots 141 may have a core-shell structure including one semiconductor nanocrystal core particle and another semiconductor nanocrystal shell surrounding the core. The core and the shell may have a concentration gradient wherein the concentration of the element(s) of the shell decreases toward the core. In addition, the quantum dots 141 may have one semiconductor nanocrystal core and multi-shells surrounding the core. Herein, the multi-layered shell structure has a structure of two or more shells and each layer may have a single composition or an alloy or may have a concentration gradient.

When the quantum dots 141 have a core-shell structure, a material composition of the shell has a larger bandgap energy than that of the core, which may exhibit an effective quantum confinement effect. However, the embodiment is not limited thereto. Meanwhile, in the multi-layered shell, a shell that is outside of the core has may have a higher bandgap energy than a shell that is near to the core and quantum dots may have an ultraviolet (UV) to infrared wavelength ranges.

The quantum dots 141 may have quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 90%, or even 100%.

In a display, the quantum dots 141 may have a relatively narrow spectrum so as to improve color purity or color reproducibility. The quantum dots 141 may have for example a full width at half maximum (FWHM) of a photoluminescence wavelength spectrum of less than or equal to about 45 nm, less than or equal to about 40 nm, or less than or equal to or about 30 nm. While not wishing to be bound by theory, it is understood that within the ranges, color purity or color reproducibility of a device may be improved.

The quantum dots 141 may have a particle diameter (the longest diameter for a non-spherically shaped particle) of about 1 nm to about 100 nm. For example, the quantum dots 141 may have a particle diameter of about 1 nm to about 20 nm, for example, about 2 nm (or about 3 nm) to about 15 nm.

In addition, the shapes of the quantum dots 141 may be general shapes in this art, and thus, may not be particularly limited. For example, the quantum dots 141 may have a spherical, oval, tetrahedral, pyramidal, cuboctahedral, cylindrical, polyhedral, multi-armed, or cube nanoparticle, nanotube, nanowire, nanofiber, nanosheet, or a combination thereof. The quantum dots 141 may have any cross-sectional shape.

The quantum dots 141 may be commercially available or may be synthesized by any method known in the art. For example, several nano-sized quantum dots 141 may be synthesized according to a wet chemical process. In the wet chemical process, precursor materials react in an organic solvent to grow crystal particles, and the organic solvent or materials for forming ligands may coordinate the surface of the quantum dots 141, controlling the growth of the crystal.

An amount of the organic materials coordinated on the surface of the quantum dots 141 may be less than or equal to about 50 percent (%) by weight, for example, less than or equal to about 30 percent by weight (weight %), less than or equal to about 20 weight %, or less than or equal to about 10 weight % based on a weight of the quantum dots 141. The organic materials may include ligands, remaining organic solvents, or a combination thereof which are bound to the surface of the quantum dots.

On the other hand, the electroluminescent device 10, according to an embodiment, may include a polar ligand bound to the surface of the quantum dot 141. In other words, the quantum dot 141 is adjusted to generally have a polarity by coordinating a ligand having a polarity on the surface of the quantum dot 141 in the electroluminescent device 10, according to an embodiment. The polar ligand may be formed of a material for forming a ligand coordinated with the surface of the quantum dot 141.

The polar ligand may be chemically bound to the surface of the quantum dot 141. In an embodiment, the polar ligand may include a main chain and a polar functional group bound to the main chain.

Examples of the main chain may be a C4 to C20 alkyl group, a C4 to C20 alkenyl group, a C4 to C20 alkynyl group, or a combination thereof, and the polar functional group that is bound to the main chain may be for example a hydroxy group, a carboxyl group, a thiol group, an amine group, a carbonyl group, a phosphoric acid group, or combination thereof.

The material for forming a ligand, which is used to form the polar ligand, may have the main chain and at least two polar functional groups bound to the main chain. Herein, the main chain of the material for forming a ligand may include for example C4 to C20 alkane, C4 to C20 alkene, and C4 to C20 alkyne, and the polar functional group thereof may include at least two of at least one kind of functional group selected from a hydroxy group, a carboxyl group, a thiol group, an amine group, a carbonyl group, and a phosphoric acid group. For example, the polar functional group may include at least two homogenous functional groups or at least one heterogeneous functional group respectively.

For example, the material for forming a ligand may have a C4 to C20 alkane main chain to which at least two hydroxy groups or at least two thiol groups are bound, or a C4 to C20 alkane main chain to which at least one hydroxy group and one thiol group are respectively bound.

When the material for forming a ligand includes at least one heterogeneous functional group respectively, one functional group having a chemically strong binding force among the heterogeneous functional groups is chemically bound to the surface of the quantum dot, and thus, forms a polar ligand. However, the other functional groups not bound to the surface of the quantum dot are still bound to the main chain of the polar ligand, and as a result, the quantum dot may be endowed with a polarity.

For example, when the material for forming a ligand has a C4 to C20 alkane main chain and at least one hydroxy group and thiol group respectively bound thereto, the thiol group is chemically bound to the surface of the quantum dot, and thus, detached from the main chain. Herein, the polar ligand may have at least one hydroxy group bound to the C4 to C20 alkane main chain.

In an embodiment, when the polar ligand includes a hydroxy group as a polar functional group, a quantum dot including the polar functional group shows excellent solubility regarding an alcohol-based solvent. Accordingly, the quantum dot 141 may be uniformly dispersed by using the alcohol-based solvent during formation of the emission layer 140.

In an electroluminescent device 10, according to an embodiment, the emission layer 140 may include the quantum dots 141 in a small amount in order to exhibit excellent luminous efficiency.

For example the quantum dots 141 may be included in an amount of for example greater than or equal to about 5 weight %, greater than or equal to about 10 weight %, greater than or equal to about 15 weight %, or greater than or equal to about 20 weight %, and less than or equal to about 98 weight %, less than or equal to about 95 weight %, less than or equal to about 90 weight %, less than or equal to about 85 weight %, less than or equal to about 80 weight %, less than or equal to about 75 weight %, less than or equal to about 70 weight %, less than or equal to about 65 weight %, less than or equal to about 60 weight %, less than or equal to about 55 weight %, or less than or equal to about 50 weight %, for example about 5 weight % to about 98 weight %, about 20 weight % to about 98 weight %, about 20 weight % to about 90 weight %, about 20 weight % to about 85 weight %, or about 50 weight % to about 85 weight % based on 100 weight % of the emission layer 140.

However, an embodiment is not limited thereto, amounts of the quantum dots 141 may be different depending on the materials of the used quantum dots 141, nature of the emitted light, amounts of bound polar ligands, nature and/or amounts of the polar functional group included in the polar ligand, nature and/or amounts of the first electron transporting material, thicknesses of the hole transport layer 130, the emission layer 140, and/or the electron transport layer 150.

In an embodiment, the first electron transporting material has an electron transport capability. The first electron transporting material improves the electron transporting capability of the emission layer 140, thereby effectively confining the excitons inside the emission layer 140.

In an embodiment, the first electron transporting material may include a compound represented by Chemical Formula 1.

Chemical Formula 1

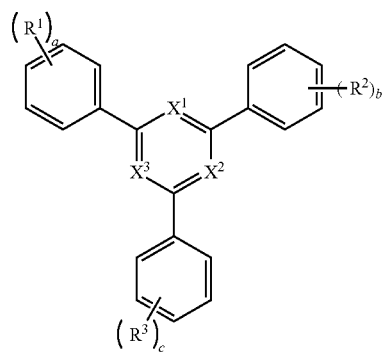

In Chemical Formula 1, $X^1$ to $X^3$ are independently selected from —C(—$R^a$)— and —N—, $R^a$ is selected from hydrogen, a substituted or unsubstituted C4 to C20 alkyl group, a substituted or unsubstituted C3 to C20 cycloalkyl group, a substituted or unsubstituted C6 to C20 aryl group, and a substituted or unsubstituted C3 to C20 heteroaryl group, $R^1$ to $R^3$ are independently selected from hydrogen, a halogen atom, —P(=O)$R^4R^5$, —PO$_2R^6$, —SO$_2R^7$, —C(=O)O$R^8$, and —C(=O)O$R^9$, wherein at least one selected from $R^1$ to $R^3$ is selected from —P(=O)$R^4R^5$ and —PO$_2R^6$, $R^4$ to $R^9$ are independently selected from hydrogen, a halogen atom, a hydroxy group, a nitro group, a cyano group, an amino group, an azido group, an amidino group, a hydrazino group, a hydrazono group, a carbamoyl group, a thiol group, a carboxyl group, a sulfonic acid group, a phosphoric acid, a vinyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C6 to C30 allyl group, a substituted or unsubstituted C1 to C30 alkoxy group, a substituted or unsubstituted C1 to C30 heteroalkyl group, a substituted or unsubstituted C3 to C30 heteroaryl group, a substituted or unsubstituted C3 to C30 cycloalkyl group, a substituted or unsubstituted C3 to C15 cycloalkenyl group, a substituted or unsubstituted C6 to C15 cycloalkynyl group, and a substituted or unsubstituted C3 to C30 heterocycloalkyl group, and a, b, and c are independently integers ranging from 1 to 5.

In an embodiment, at least one selected from $R^1$ to $R^3$ may be P(=O)$R^4R^5$, wherein $R^4$ and $R^5$ are independently selected from hydrogen, a halogen atom, a substituted or unsubstituted C1 to C30 alkyl group, a substituted or unsubstituted C1 to C30 heteroalkyl group, a substituted or unsubstituted C6 to C30 aryl group, a substituted or unsubstituted C7 to C30 arylalkyl group, and a substituted or unsubstituted C3 to C30 heteroaryl group.

In an embodiment, the first electron transporting material may be represented by Chemical Formula 2.

Chemical Formula 2

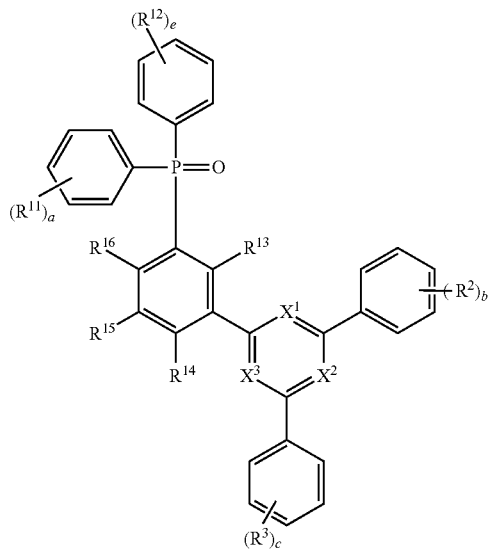

In Chemical Formula 2, $X^1$ to $X^3$, $R^2$, and $R^3$ are the same as defined in claim 1, $R^{11}$ to $R^{16}$ are independently selected from hydrogen, a substituted or unsubstituted C4 to C20 alkyl group, a substituted or unsubstituted C3 to C20 cycloalkyl group, a substituted or unsubstituted C6 to C20 aryl group, a substituted or unsubstituted C3 to C20 heteroaryl group, a substituted or unsubstituted alkylamine group, and a substituted or unsubstituted arylamine group, and b, c, d, and e are independently integers ranging from 1 to 5.

In an embodiment, at least one $R^2$ to $R^3$ may be P(=O)$R^4R^5$. For example, both $R^2$ and $R^3$ may be P(=O)$R^4R^5$. In this embodiment, $R^4$ and $R^5$ may independently be selected from hydrogen, a halogen atom, a substituted or unsubstituted C1 to C30 alkyl group, a substituted or unsubstituted C1 to C30 heteroalkyl group, a substituted or unsubstituted C6 to C30 aryl group, a substituted or unsubstituted C7 to C30 arylalkyl group, and a substituted or unsubstituted C3 to C30 heteroaryl group.

In an embodiment, the first electron transporting material may be represented by Chemical Formula 3.

Chemical Formula 3

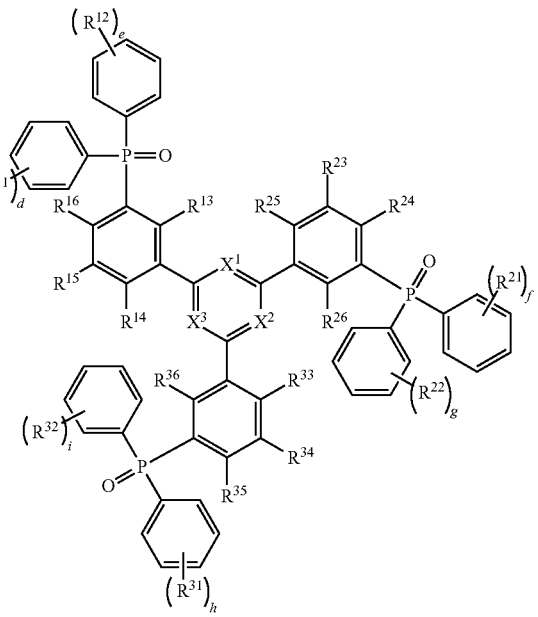

In Chemical Formula 3, $X^1$ to $X^3$ may each be —C(—$R^a$)— or may each be —N—, $R^a$ is selected from hydrogen, a substituted or unsubstituted C4 to C20 alkyl group, a substituted or unsubstituted C3 to C20 cycloalkyl group, a substituted or unsubstituted C6 to C20 aryl group, and a substituted or unsubstituted C3 to C20 heteroaryl group, $R^{11}$ to $R^{16}$, $R^{21}$ to $R^{26}$, and $R^{31}$ to $R^{36}$ are independently selected from hydrogen, a substituted or unsubstituted C4 to C20 alkyl group, a substituted or unsubstituted C3 to C20 cycloalkyl group, a substituted or unsubstituted C6 to C20 aryl group, a substituted or unsubstituted C3 to C20 heteroaryl group, a substituted or unsubstituted alkylamine group, and a substituted or unsubstituted arylamine group, and d, e, f, g, h, and l are independently integers ranging from 1 to 5.

In an embodiment, $X^1$ to $X^3$ may each be —C(—$R^a$)—. Herein, $R^a$ of $X^1$ to $X^3$ may be all hydrogen. However, the embodiment is not limited thereto, at least one selected from $X^1$ to $X^3$ may be —N— or all $X^1$ to $X^3$ may be —N—.

For example, the first electron transporting material, according to an embodiment, may include compounds represented by Chemical Formula A and/or Chemical Formula B.

Chemical Formula A

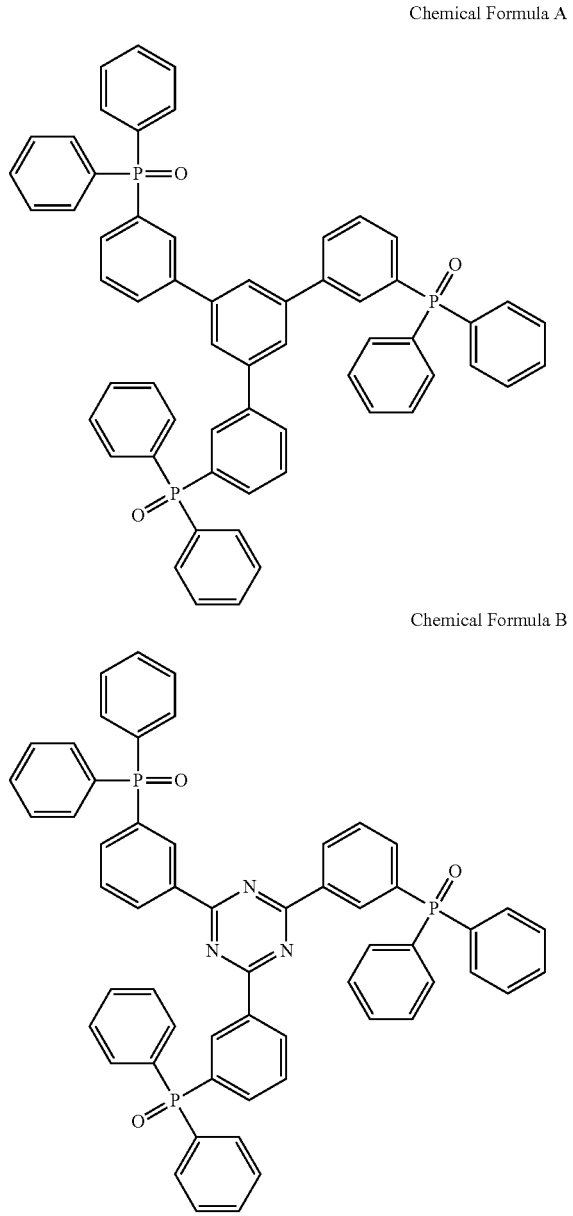

Chemical Formula B

On the other hand, a quantum dot is in general coordinated with a ligand in order to secure stability such as life-span and the like. However, the ligand coordinated with the quantum dot is in general an insulating ligand including an aliphatic hydrocarbon main chain, and this insulating ligand may deteriorate electron mobility of the emission layer. Accordingly, when the quantum dot to which the insulating ligand is attached is used, an electron/hole carrier balance inside the emission layer may be difficult to obtain.

Accordingly, at the time of driving the electroluminescent device, electrons and holes may not encounter each other at the center of the emission layer, but may be present on the interface with the electron transport layer or the hole transport layer. In this embodiment, there is a possibility that the quantum efficiency of the emission layer is significantly lowered, and therefore, it is necessary to set the electron/hole carrier balance in the electroluminescent device to an appropriate level.

This electron/hole carrier balance may have a direct influence on quantum efficiency and a life-span of an electroluminescent device and, for example, when an organic depositable material is used to form an electron transport layer, both the electron transport layer and the emission layer all have low electron mobility, and thus, may fail in realizing an electron/hole carrier balance of a device.

However, the emission layer 140, according to an embodiment, includes the first electron transporting material along with the quantum dot 141 to improve electron mobility.

The first electron transporting material has a structure represented by Chemical Formula 1, which is a non-planar structure, wherein three substituted or unsubstituted aryl groups are bound to a central aromatic hydrocarbon (arene). The structure represented by Chemical Formula 1 has a relatively low rotational energy barrier of the aryl groups with respect to the central aromatic hydrocarbon and has a π-conjugated structure, and thus, works as a pathway for electrons, and in addition, since hydrogen of the three aryl groups is relatively easily substituted, an energy level is easy to adjust.

In addition, the first electron transporting material may have a phosphorous-based oxide functional group and specifically, at least one selected from $P(=O)R^4R^5$ and $-PO_2R^6$ as at least one selected from three aryl groups. The phosphorous-based oxide functional group may show strong electron-withdrawing property due to lone pair electrons forming an oxygen π-orbital and also excellent solubility regarding an alcohol-based solvent due to a (P—O) or (P=O) bond.

In other words, the first electron transporting material, according to an embodiment, may much improve electron mobility of an emission layer 140 through strong electron-withdrawing ability of the phosphorous-based oxide and excellent electron-moving ability of a triarylarene core structure expressed in Chemical Formula 1.

Accordingly, since electrons are easily injected into the emission layer 140 through the first electron transporting material, the electroluminescent device 10 may be turned on faster, even though an organic depositable material is used to form an electron transport layer, electron/hole carriers injected into the emission layer 140 may be easily balanced, and in addition, an electric field voltage applied to the emission layer 140 may be decreased, and as a result, both luminous efficiency and maximum luminance may be improved.

In addition, the first electron transporting material, according to an embodiment, has excellent solubility regarding an alcohol-based solvent, and thus, may be easily formed into the emission layer 140 as a thin film having a uniform thickness along with the quantum dot 141 to which the above polar ligand is attached by using a wet process and the like.

On the other hand, the first electron transporting material may be included for example in an amount of greater than or equal to about 5 weight %, for example, greater than or equal to about 6 weight %, greater than or equal to about 7 weight %, greater than or equal to about 8 weight %, greater than or equal to about 9 weight %, or greater than or equal to about 10 weight %, and less than or equal to about 30 weight %, for example, less than or equal to about 25 weight %, or less than or equal to about 20 weight %, for example, in a range of about 5 weight % to about 30 weight %, about 5 weight % to about 25 weight %, about 10 weight % to about 25 weight %, or about 10 weight % to about 20 weight % based on 100 weight % of the emission layer 140.

While not wishing to be bound by theory, it is understood that when the first electron transporting material is included in an amount of less than 5 weight % in the emission layer 140, electron mobility of the emission layer 140 may be little improved, but when the first electron transporting material is included in an amount of greater than about 30 weight %, an amount of the quantum dot 141 is decreased, and accordingly, luminous efficiency may be deteriorated, and electron/hole carriers may be difficult to balance.

In an embodiment, a thickness of the emission layer 140 may be variously selected in consideration of each material, each electron/hole mobility, and each thickness of the hole transport layer 130, and the electron transport layer 150, nature and amounts of the quantum dot 141 and the first electron transporting material, and the like but may have for example an average thickness of about 15 nm to about 100 nm, about 20 nm to about 60 nm, about 20 nm to about 50 nm, about 20 nm to about 40 nm, or about 25 nm to about 30 nm.

While not wishing to be bound by theory, it is understood that when the thickness of the emission layer 140 is less than 15 nm, voids, cracks, and the like present in the emission layer 140 are liable to act as leakage paths of electrons/holes to largely deteriorate device characteristics, so it may be difficult to match a carrier balance with other constituent elements of the electroluminescent device.

On the other hand, when the thickness of the emission layer 140 is greater than 100 nm, it may be difficult to match the electron/hole carrier balance and the current and voltage conditions required for driving become too high, thereby making it difficult to achieve efficient light emission.

That is, when the thickness range of the emission layer 140 is out of the above range, electrons relative to holes may be supplied to the emission layer 140 too rapidly and/or too excessively, and thus, electrons may be combined with holes on the interface between the emission layer 140 and the hole transport layer 130 to cause interface light emission or may be transported to the hole injection layer 120 and the hole transport layer 130 and then may be quenched.

However, the thickness of the emission layer 140, according to an embodiment, may be variously adjusted in consideration of a relationship with the materials and thicknesses of the other components. For example, the thickness of the emission layer 140 may be less than or equal to about 60 nm so as to minimize the field-induced quenching induced by an electric field, by reducing a turn-on voltage and an electric field of the emission layer, in consideration of luminous efficiency of the emission layer 140, nm or less.

The electroluminescent device 10, according to an embodiment, improves transporting capability of the emission layer 140 and improves electron transporting/injection capability through the first electron transporting material included in the emission layer 140 in the device. As a result, it is easy to match an electron/hole carrier balance in the device.

The electron transport layer 150 is disposed between the emission layer 140 and the second electrode 160, and thus, transports/supplies electrons into the emission layer 140.

In an embodiment, a thickness of the electron transport layer 150 may be variously changed in consideration of a charge carrier balance of the hole injection layer 120, the hole transport layer 130, and/or the emission layer 140 in the device, but may be for example greater than or equal to about 20 nm, greater than or equal to about 30 nm, greater than or equal to about 40 nm, or greater than or equal to about 50 nm, and for example less than or equal to about 100 nm, less than or equal to about 90 nm, less than or equal to about 80 nm, less than or equal to about 70 nm, or less than or equal to about 60 nm, for example about 20 nm to about 100 nm, about 20 nm to about 90 nm, about 30 nm to about 80 nm, about 40 mm to about 80 nm, or about 60 nm to about 80 nm.

When the electron transport layer 150 has a thickness out of the ranges, voids, cracks, and the like of the electron transport layer 150 may have large effect on electron transporting capability to largely decrease device characteristics, and it is difficult to meet a carrier balance with other constituent elements of the electroluminescent device.

In an embodiment, the electron transport layer 150 may consist of non-light-emitting electron transporting materials that do not emit light by an electric field so that electrons may not be quenched internally.

On the other hand, the electron transport layer 150 may be an organic layer formed by deposition. In an embodiment, the organic layer may include a second electron transporting material. The second electron transporting material may be a material that is different from the first electron transporting material. The second electron transporting material may be an organic depositable material. For example, the second electron transporting material may be an organic depositable monomolecular material.

Examples of the second electron transporting material may be 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, 8-hydroxyquinolinato lithium (LiQ), ET204 (8-(4-(4,6-di(naphthalen-2-yl)-1,3,5-triazin-2-yl)phenyl)quinolone), BPhen, ABH113, NET218, NET338, NET430, NDN77, NDN87, or a combination thereof. The electron transport layer 150 may be formed by depositing and/or co-depositing at least one organic depositable material.

In this way, when the electron transport layer 150 is formed by using the organic depositable material, the electron transport layer 150 may improve thickness uniformity and surface morphology compared with an electron transport layer for example formed of an inorganic material nano particle such as ZnO, ZnMgO, and the like. Accordingly, when the organic depositable material is used, the electron transport layer 150 may have high reliability in terms of preventing a leakage current.

However, an embodiment is not necessarily limited thereto, but the electron transport layer 150 may further include a layer formed of inorganic material nanoparticles in consideration of an electron/hole carrier balance of the electroluminescent device 10 or an inorganic layer itself formed of inorganic material nanoparticles but not an organic layer formed through the deposition.

On the other hand, an electron injection layer facilitating injection of electrons and/or a hole blocking layer blocking movement of holes may be further disposed between the electron transport layer 150 and the second electrode 160.

Each thickness of the electron injection layer and the hole blocking layer may be desirably selected. For example, a thickness of each layer may be in a range of greater than or equal to about 1 nm and less than or equal to about 500 nm but is not limited thereto. The electron injection layer may be a layer formed through deposition.

The electron injection layer may include for example at least one selected from 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, 8-hydroxyquinolinato lithium (LiQ), n-type metal oxide (e.g., ZnO, $HfO_2$, etc.), ET204 (8-(4-(4,6-di(naphthalen-2-yl)-1,3,5-triazin-2-yl)phenyl) quinolone), BPhen, ABH113, NET218, NET338, NET430, NDN77, NDN87, and a combination thereof, but is not limited thereto.

The hole blocking layer may include for example at least one selected from 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, and a combination thereof, but is not limited thereto.

As described above, the electroluminescent device 10, according to an embodiment, may improve electron mobility of the emission layer 140 by including the quantum dots and the first electron transporting material in the emission layer 140.

In addition, the first electron transporting material included in the emission layer 140 has excellent solubility regarding an alcohol-based solvent, and accordingly, the emission layer 140 may be easily formed to have a relatively uniform thickness.

As a result, the emission layer 140 may provide the electroluminescent device 10 having much improved luminous efficiency and luminance.

Hereinafter, a display device including the electroluminescent device 10 is described.

A display device, according to an embodiment, includes a substrate, a driving circuit formed on the substrate, and a first electroluminescent device, a second electroluminescent device, and a third electroluminescent device spaced apart from each other in a predetermined interval and disposed on the driving circuit.

The first to third electroluminescent devices have the same structure as the electroluminescent device 10 and but the wavelengths of the lights emitted from each quantum dots may be different from each other.

In an embodiment, the first electroluminescent device is a red device emitting red light, the second electroluminescent device is a green device emitting green light, and the third electroluminescent device is a blue device emitting blue light. In other words, the first to third electroluminescent devices may be pixels expressing red, green, and blue, respectively, in the display device.

However, an embodiment is not necessarily limited thereto, but the first to third electroluminescent devices may respectively express magenta, yellow, cyan, or may express other colors.

One of the first to third electroluminescent devices may be the electroluminescent device 10. In this embodiment, the third electroluminescent device displaying at least blue may be desirably the electroluminescent device 10.

In the display device, according to an embodiment, a hole injection layer, a hole transport layer, an electron transport layer, an electron injection layer, and a hole blocking layer except an emission layer of each pixel may be integrated to form a common layer. However, an embodiment is not limited thereto. A hole injection layer, a hole transport layer, an electron transport layer, an electron injection layer, and a hole blocking layer may be independently formed in each pixel of the display device, or at least one selected from a hole injection layer, a hole transport layer, an electron transport layer, an electron injection layer, and a hole blocking layer may form a common layer and remaining layers may form a separate independent layer.

The substrate may be a transparent insulating substrate or may be made of a ductile material. The substrate may include glass or a polymer material in a film having a glass transition temperature ($T_g$) of greater than about 150° C. For example, it includes a COC (cycloolefin copolymer) or COP (cycloolefin polymer) based material. All the first to third electroluminescent devices are formed on the substrate. That is, a substrate of the display device, according to an embodiment, provides a common layer.

The driving circuit is disposed on the substrate and is independently connected to each of the first to third electroluminescent devices. The driving circuit may include at least one line including a scan line, a data line, a driving power source line, a common power source line, and the like, at least two of thin film transistors (TFT) connected to the wire and corresponding to one organic light emitting diode, and at least one capacitor, or the like. The driving circuit may have a variety of the known structures.

As described above, a display device, according to an embodiment, may exhibit improved device efficiency, and thus, excellent photoluminescence characteristics.

Hereinafter, the embodiments are illustrated in more detail with reference to examples. However, these examples are exemplary, and the present disclosure is not limited thereto.

Preparation Example 1

6-Mercaptohexanol (MCH) as a material for forming a ligand on the surface of a blue quantum dot and a blue quantum dot (ZnTeSe, an average particle diameter: 9 nm) are mixed with methanol to coordinate a polar ligand on the surface of the blue quantum dot. The non-reactants and the residual methanol are subsequently removed therefrom. A thiol group included in the 6-mercaptohexanol is chemically bound to the blue quantum dot to fix the polar ligand into the quantum dot, and a hydroxy group in the 6-mercaptohexanol may endow excellent solubility of the ligand-modified blue quantum dot in an alcohol-based solvent.

Subsequently, 10 mmol of the blue quantum dot to which the polar ligand is attached and 2 mmol of a compound represented by Chemical Formula A are placed in 10 mL of methanol and stirred for 5 minutes to prepare a composition for an emission layer.

The compound represented by Chemical Formula A is included in an amount of 10 weight % based on a total amount of the blue quantum dot and the compound represented by Chemical Formula A.

Chemical Formula A

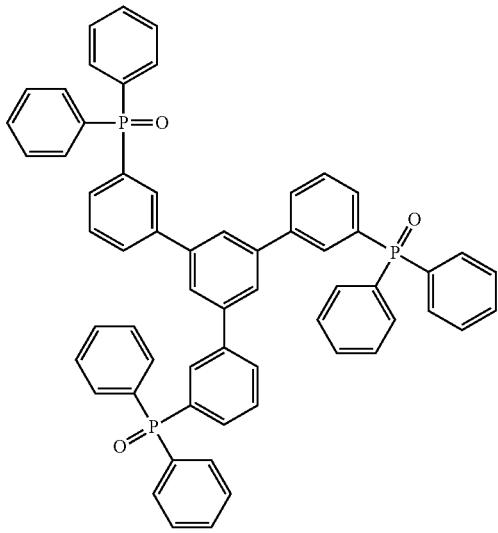

Preparation Example 2

A composition for an emission layer is prepared according to the same method as Preparation Example 1 except that the amount of the compound represented by Chemical Formula A is adjusted into 10 weight % based on a total amount of the blue quantum dot and the compound represented by Chemical Formula A.

Comparative Preparation Example

A composition for an emission layer is prepared according to the same method as Preparation Example 1 except that the compound represented by Chemical Formula A is not included for the mixing. The composition for an emission layer according to Comparative Preparation Example includes no compound represented by Chemical Formula A.

Evaluation 1: Surface Characteristics of Emission Layer

Each composition for an emission layer according to Preparation Examples 1 to 2 and Comparative Preparation Example is spin-coated on a glass substrate and heat-treated at 80° C. for 30 minutes to respectively form an emission layer thin film having an average thickness of about 25 nm.

Subsequently, FIGS. 2 to 4 respectively show a scanning electron microscopic (SEM) image of the upper surface of each emission layer thin film.

Figure 2:
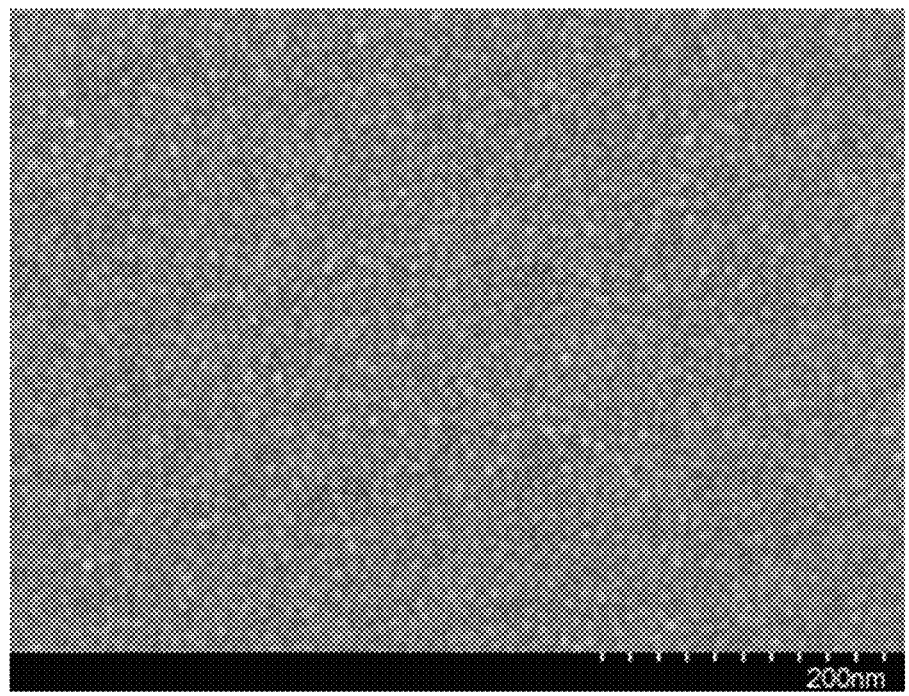
FIGS. 2 to 4 are scanning electron microscopic (SEM) images showing upper surfaces of the emission thin films: Preparation Example 1 (FIG. 2), Preparation Example 2 (FIG. 3), and Comparative Preparation Example (FIG. 4)
Figure 3:
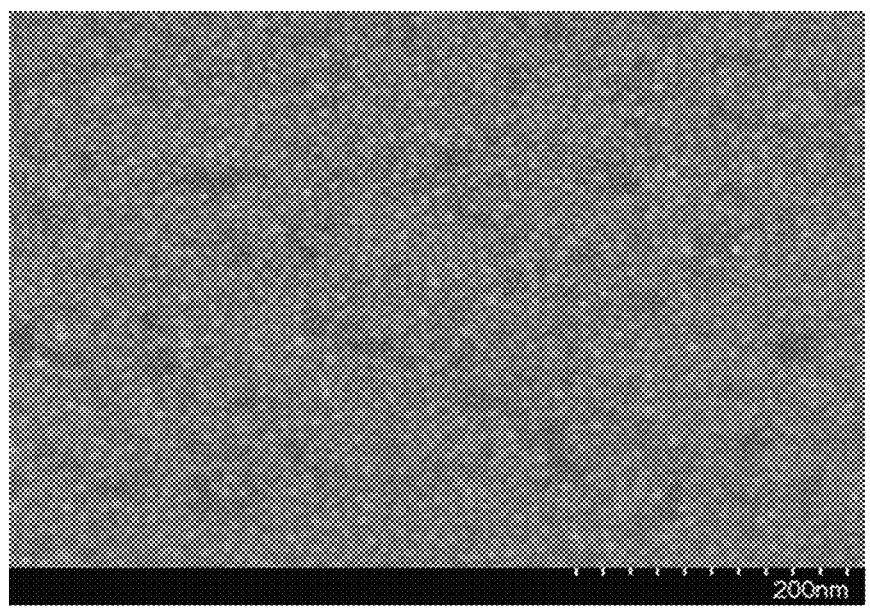
Figure 4:
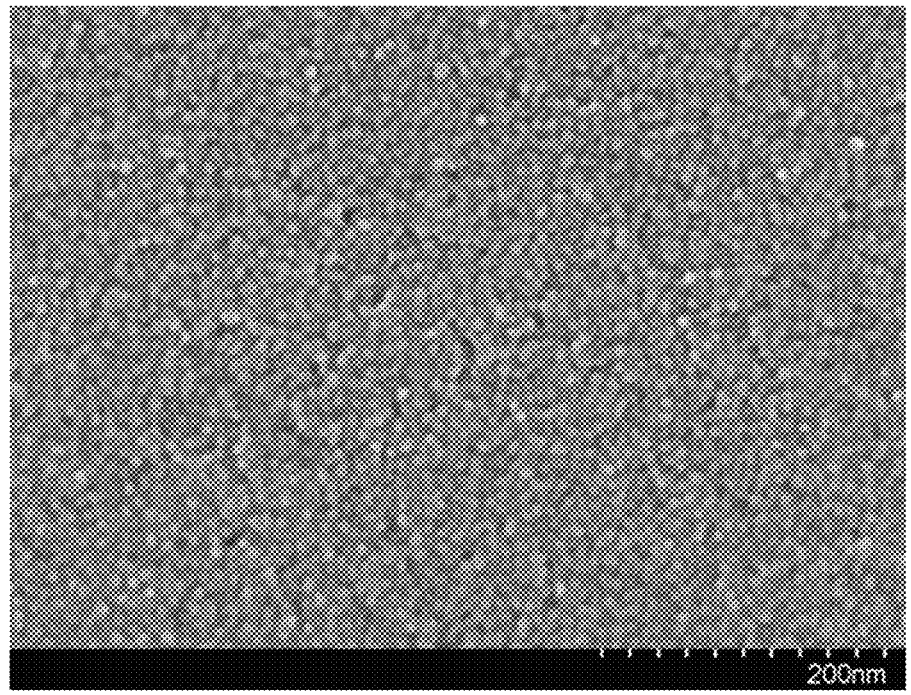

The scanning electron microscopic (SEM) images of FIGS. 2 to 4 respectively show Preparation Example 1 (FIG. 2), Preparation Example 2 (FIG. 3), and Comparative Preparation Example (FIG. 4).

Referring to FIGS. 2 to 4, Preparation Examples 1 and 2 including each amount of 10 weight % and 20 weight % of the electron transporting material blended in based on 100 weight % of a total amount of the emission layer thin film show a uniform blue quantum dot distribution compared with Comparative Preparation Example not including the electron transporting material.

Particularly, Comparative Preparation Example not including the electron transporting material turns out to have a plurality of pores on the surface.

Referring to the results of FIGS. 2 to 4, an emission layer formed by blending a blue quantum dot and an electron transporting material shows excellent surface morphology compared with an emission layer including only the blue quantum dot.

EXAMPLE

A glass substrate deposited with ITO as a first electrode (an anode) is surface-treated with UV-ozone for 15 minutes, a hole injection layer having an average thickness of 30 nm is formed thereon by spin-coating a PEDOT:PSS solution (H.C. Starks) and thermally treating it at 150° C. for 10 minutes under an air atmosphere and then, at 150° C. for 10 minutes under a $N_2$ atmosphere.

Subsequently, a hole transport layer having an average thickness of 25 nm is formed on the hole injection layer by spin-coating a solution for a hole transport layer prepared by dissolving poly[(9,9-dioctylfluorenyl-2,7-diyl-co(4,4'-(N-4-butylphenyl)diphenylamine] (TFB) (Sumitomo) in toluene and thermally treating it at 150° C. for 30 minutes.

Subsequently, the composition for an emission layer according to Preparation Example 1 is spin-coated on the hole transport layer and heated at 80° C. to form a blue emission layer having an average thickness of 25 nm.

Subsequently, an electron transport layer having an average thickness of 35 nm is formed on the blue emission layer by co-depositing NET430 and NDN77 in a weight ratio of 1:1.

Then, a second electrode is formed by vacuum-depositing aluminum (Al) to be 90 nm thick on the electron transport layer to manufacture an electroluminescent device according to Example.

Comparative Example

An electroluminescent device according to Comparative Example is manufactured according to the same method as Example 1, except that the composition for an emission layer according to Comparative Preparation Example is used instead of the composition for an emission layer according to Preparation Example 1.

Evaluation 2: Device Characteristics of Electroluminescent Device

Device characteristics of the electroluminescent devices according to Example and Comparative Example are measured and then, respectively shown in FIGS. 5 to 9.

Figure 5:
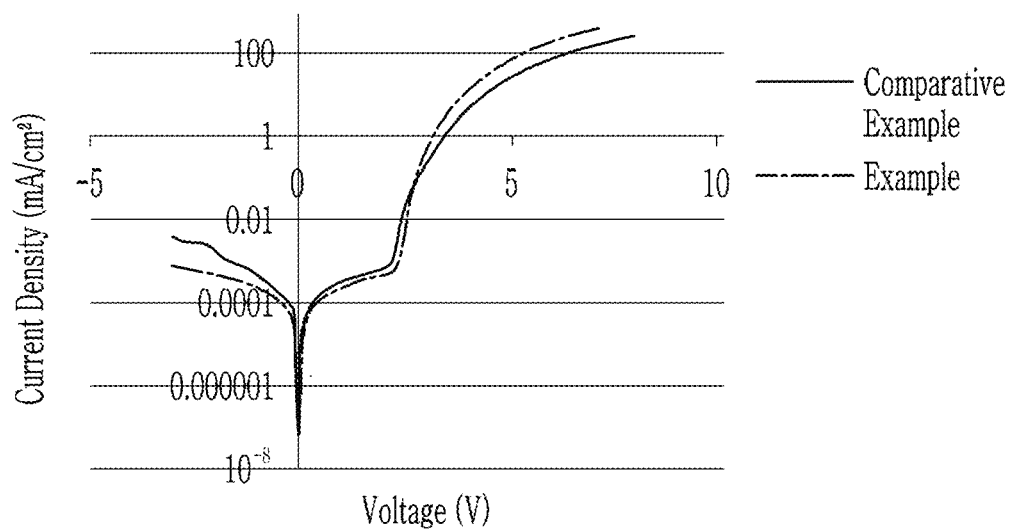
FIG. 5 is a graph of current density (milliamperes per square centimeter) versus voltage (volts, V) showing voltage-current density (log scale) characteristics of the electroluminescent devices according to Example and Comparative Example.
Figure 6:
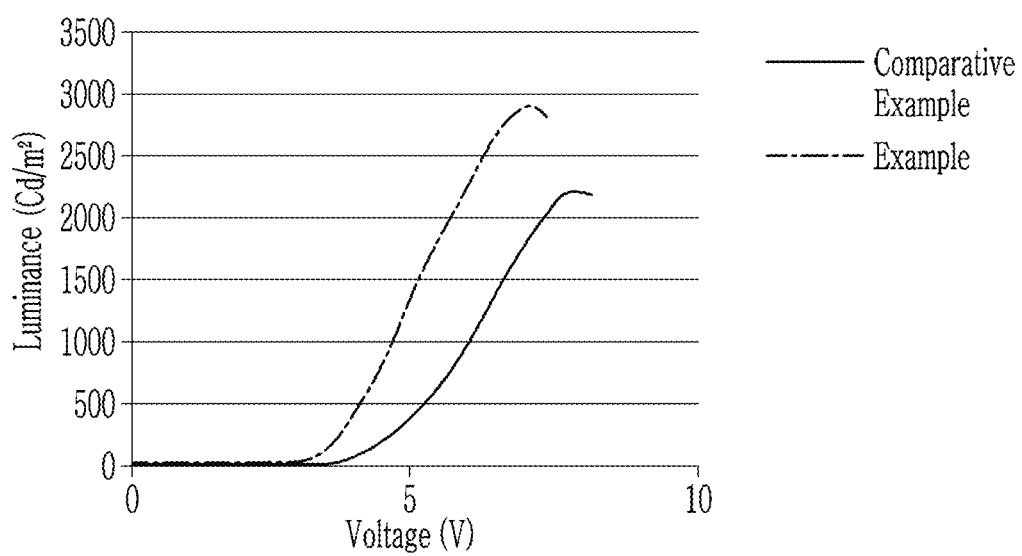
FIG. 6 is a graph of luminescence (candelas per square meter, $cd/m^2$) versus voltage (volts, V) showing voltage-luminance of the electroluminescent devices according to Example and Comparative Example.

FIG. 5 is a graph showing voltage-current density (log scale) characteristics of the electroluminescent devices according to Example and Comparative Example, and FIG. 6 is a graph showing voltage-luminance of the electroluminescent devices according to Example and Comparative Example.

Referring to FIGS. 5 and 6, the electroluminescent devices according to Example shows a significantly decreased turn-on voltage compared with Comparative Example. Specifically, referring to FIG. 6, the electroluminescent devices of Example and Comparative Example respectively show a voltage of 4.1 volts (V) and 3.7 V at 5 milliamperes (mA), and Example shows maximum luminance of 2,900 candelas per square meter ($Cd/m^2$), while Comparative Example shows maximum luminance of 2,100 $Cd/m^2$.

Based on the result of FIGS. 5 and 6, Example including an electron transporting material represented by Chemical Formula A in an emission layer shows much increased electron mobility, and thus, a low turn-on voltage and high luminance compared with Comparative Example.

Figure 7:
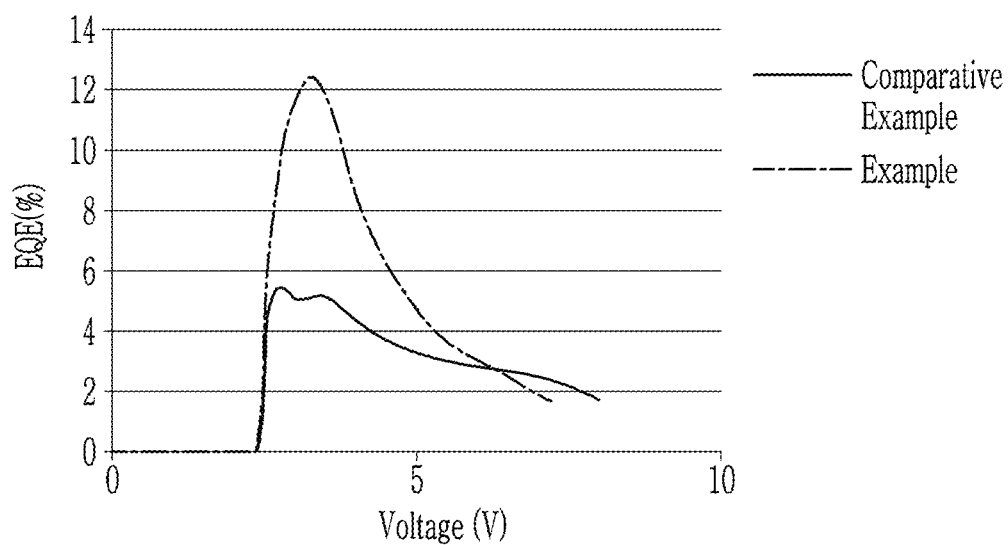
FIG. 7 is a graph of external quantum efficiency (percent, %) versus voltage (volts, V) showing voltage-external quantum efficiency of the electroluminescent devices according to Example and Comparative Example.
Figure 8:
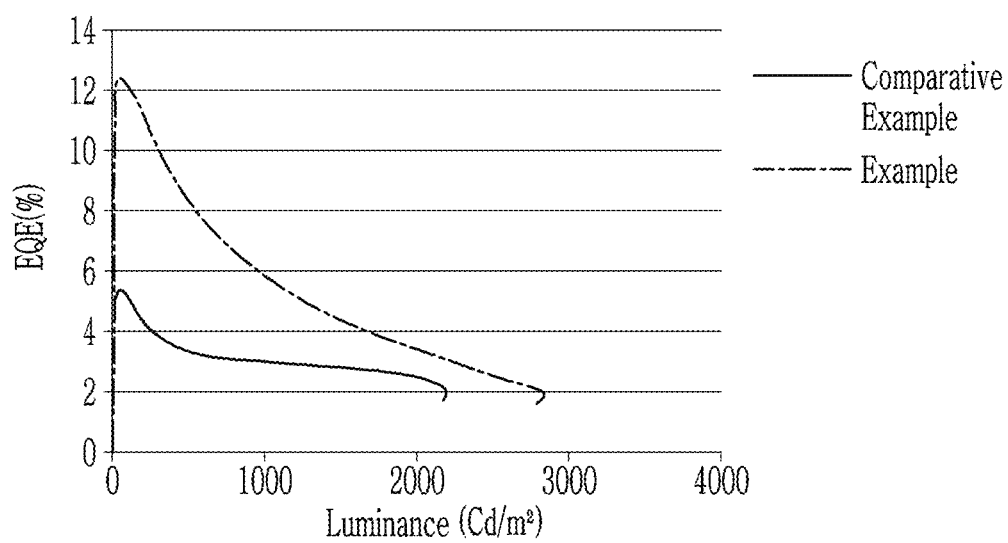
FIG. 8 is a graph of external quantum efficiency (percent, %) versus luminescence (candelas per square meter, $cd/m^2$) showing luminance-external quantum efficiency of the electroluminescent devices according to Example and Comparative Example.

FIG. 7 is a graph showing voltage-external quantum efficiency of the electroluminescent devices according to Example and Comparative Example, and FIG. 8 is a graph showing luminance-external quantum efficiency of the electroluminescent devices according to Example and Comparative Example.

Referring to FIGS. 7 and 8, the electroluminescent devices according to Example shows about 2.2 times higher external quantum efficiency than that of Comparative Example and specifically, maximum external quantum efficiency of about 12.1%, while Comparative Example shows maximum external quantum efficiency of about 5.4%.

In addition, the electroluminescent device of Example shows external quantum efficiency of 12.1% at 100 nits, 8.6% at 500 nits, and 6.1% at 1,000 nits, while the electroluminescent device of Comparative Example shows much lower external quantum efficiency of 5.4% at 100 nits, 3.3% at 500 nits, and 2.9% at 1,000 nits respectively compared with one of the Examples.

Accordingly, the results of FIGS. 7 and 8 show that when electron mobility of an emission layer is improved by an electron transporting material included in the emission layer, both external quantum efficiency and luminance are much increased.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. An electroluminescent device comprising:
   a first electrode and a second electrode facing each other;
   an emission layer disposed between the first electrode and the second electrode, wherein the emission layer comprises a plurality of quantum dots and a first electron transporting material represented by Chemical Formula 1;
   a hole transport layer disposed between the emission layer and the first electrode; and
   an electron transport layer disposed between the emission layer and the second electrode:

Chemical Formula 1

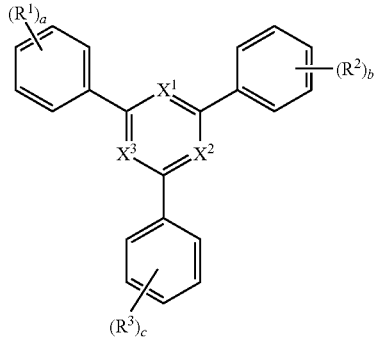

wherein, in Chemical Formula 1,
$X^1$ to $X^3$ are independently selected from $C(R^a)$ and N, $R^a$ is selected from hydrogen, a substituted or unsubstituted C4 to C20 alkyl group, a substituted or unsubstituted C3 to C20 cycloalkyl group, a substituted or unsubstituted C6 to C20 aryl group, and a substituted or unsubstituted C3 to C20 heteroaryl group, $R^1$ to $R^3$ are independently selected from hydrogen, a halogen atom, $-P(=O)R^4R^5$, $-PO_2R^6$, $-SO_2R^7$, $-C(=O)R^8$, and $-C(=O)OR^9$, wherein at least one selected from $R^1$ to $R^3$ is $-P(=O)R^4R^5$ or $-PO_2R^6$, $R^4$ to $R^9$ are independently selected from hydrogen, a halogen atom, a hydroxy group, a nitro group, a cyano group, an amino group, an azido group, an amidino group, a hydrazino group, a hydrazono group, a carbamoyl group, a thiol group, a carboxyl group, a sulfonic acid group, a phosphoric acid, a vinyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C6 to C30 allyl group, a substituted or unsubstituted C1 to C30 alkoxy group, a substituted or unsubstituted C1 to C30 heteroalkyl group, a substituted or unsubstituted C3 to C30 heteroaryl group, a substituted or unsubstituted C3 to C30 cycloalkyl group, a substituted or unsubstituted C3 to C15 cycloalkenyl group, a substituted or unsubstituted C6 to C15 cycloalkynyl group, and a substituted or unsubstituted C3 to C30 heterocycloalkyl group, and a, b, and c are independently integers ranging from 1 to 5.

2. The electroluminescent device of claim 1, wherein at least one selected from $R^1$ to $R^3$ is $P(=O)R^4R^5$, wherein $R^4$ and $R^5$ are independently selected from hydrogen, a halogen atom, a substituted or unsubstituted C1 to C30 alkyl group, a substituted or unsubstituted C1 to C30 heteroalkyl group, a substituted or unsubstituted C6 to C30 aryl group, a substituted or unsubstituted C7 to C30 arylalkyl group, and a substituted or unsubstituted C3 to C30 heteroaryl group.

3. The electroluminescent device of claim 1, wherein the first electron transporting material is represented by Chemical Formula 2:

Chemical Formula 2

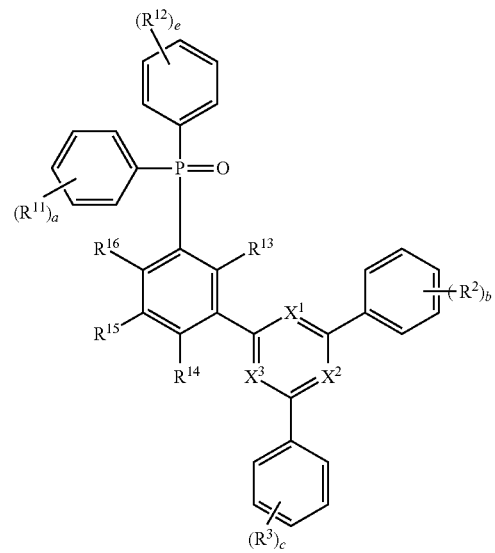

wherein, in Chemical Formula 2, $X^1$ to $X^3$, $R^2$, and $R^3$ are the same as defined in claim 1, $R^{11}$ to $R^{16}$ are independently selected from hydrogen, a substituted or unsubstituted C4 to C20 alkyl group, a substituted or unsubstituted C3 to C20 cycloalkyl group, a substituted or unsubstituted C6 to C20 aryl group, a substituted or unsubstituted C3 to C20 heteroaryl group, a substituted or unsubstituted alkylamine group, and a substituted or unsubstituted arylamine group, and b, c, d, and e are independently integers ranging from 1 to 5.

4. The electroluminescent device of claim 3, wherein at least one selected from $R^2$ to $R^3$ is $P(=O)R^4R^5$, wherein $R^4$ and $R^5$ are independently selected from hydrogen, a halogen atom, a substituted or unsubstituted C1 to C30 alkyl group, a substituted or unsubstituted C1 to C30 heteroalkyl group, a substituted or unsubstituted C6 to C30 aryl group, a substituted or unsubstituted C7 to C30 arylalkyl group, and a substituted or unsubstituted C3 to C30 heteroaryl group.

5. The electroluminescent device of claim 3, wherein both $R^2$ and $R^3$ are $P(=O)R^4R^5$, wherein $R^4$ and $R^5$ are independently selected from hydrogen, a halogen atom, a substituted or unsubstituted C1 to C30 alkyl group, a substituted or unsubstituted C1 to C30 heteroalkyl group, a substituted or unsubstituted C6 to C30 aryl group, a substituted or unsubstituted C7 to C30 arylalkyl group, and a substituted or unsubstituted C3 to C30 heteroaryl group.

6. The electroluminescent device of claim 1, wherein the first electron transporting material is represented by Chemical Formula 3:

Chemical Formula 3

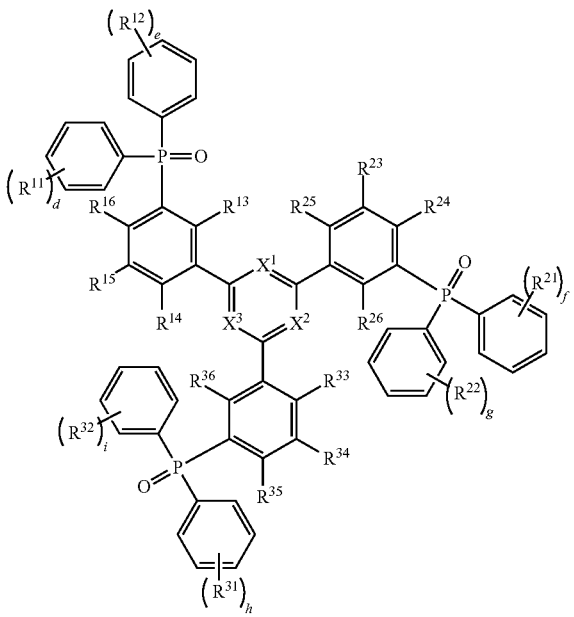

wherein, in Chemical Formula 3, $X^1$ to $X^3$ are each —C(—$R^a$)— or are each —N—, $R^a$ is selected from hydrogen, a substituted or unsubstituted C4 to C20 alkyl group, a substituted or unsubstituted C3 to C20 cycloalkyl group, a substituted or unsubstituted C6 to C20 aryl group, and a substituted or unsubstituted C3 to C20 heteroaryl group, $R^{11}$ to $R^{16}$, $R^{21}$ to $R^{26}$, and $R^{31}$ to $R^{36}$ are independently selected from hydrogen, a substituted or unsubstituted C4 to C20 alkyl group, a substituted or unsubstituted C3 to C20 cycloalkyl group, a substituted or unsubstituted C6 to C20 aryl group, a substituted or unsubstituted C3 to C20 heteroaryl group, a substituted or unsubstituted alkylamine group, and a substituted or unsubstituted arylamine group, and d, e, f, g, h, and l are independently integers ranging from 1 to 5.

7. The electroluminescent device of claim 1, wherein $X^1$ to $X^3$ are each —C(—$R^a$)— wherein $R^a$ is hydrogen.

8. The electroluminescent device of claim 1, wherein $X^1$ to $X^3$ are each —N—.

9. The electroluminescent device of claim 1, wherein the first electron transporting material is included in an amount of about 5 percent by weight to about 30 percent by weight based on a total amount, 100 percent by weight of the emission layer.

10. The electroluminescent device of claim 1, wherein a polar ligand bound to a surface of the quantum dot is further included.

11. The electroluminescent device of claim 1, wherein the polar ligand comprises a main chain comprising a C4 to C20 alkyl group, a C4 to C20 alkenyl group, a C4 to C20 alkynyl group, or a combination thereof; and a polar functional group selected from a hydroxy group, a carboxyl group, a thiol group, an amine group, a carbonyl group, and a phosphoric acid group, wherein the polar functional group is bound to the main chain.

12. The electroluminescent device of claim 11, wherein the polar functional group comprises at least one hydroxy group.

13. The electroluminescent device of claim 1, wherein the quantum dot comprises a Group II-VI compound that does not comprise Cd, a Group III-V compound, a Group IV-VI compound, a Group IV element or compound, a Group I-III-VI compound, a Group I-II-IV-VI compound that does not comprise Cd, or a combination thereof.

14. The electroluminescent device of claim 1, wherein the quantum dot has a core-shell structure.

15. The electroluminescent device of claim 1, wherein the electron transport layer comprises a second electron transporting material that is different from the first electron transporting material.

16. The electroluminescent device of claim 15, wherein the second electron transporting material comprises 1,4,5,8-naphthalene-tetracarboxylic dianhydride (NTCDA), bathocuproine (BCP), tris[3-(3-pyridyl)-mesityl] borane (3TPYMB), LiF, Alq$_3$, Gaq$_3$, Inq$_3$, Znq$_2$, Zn(BTZ)$_2$, BeBq$_2$, 8-hydroxyquinolinato lithium (LiQ), ET204 (8-(4-(4,6-di(naphthalen-2-yl)-1,3,5-triazin-2-yl)phenyl)quinolone), BPhen, ABH113, NET218, NET338, NET430, NDN77, NDN87, or a combination thereof.

17. The electroluminescent device of claim 1, wherein the hole transport layer comprises a poly(3,4-ethylenedioxythiophene) compound, a poly(styrenesulfonate) compound, a poly-N-vinylcarbazole compound, a polyphenylenevinylene compound, a polyparaphenylenevinylene compound, a polymethacrylate compound, a polyarylamine compound, a polyaniline compound, a polypyrrole compound, a poly(9,9-octylfluorene) compound, a poly(spiro-fluorene) compound, a poly-(N,N'-diphenyl-N,N'-bis(3-methylphenyl)-(1,1'-biphenyl)-4,4'-diamine), a poly[(9,9-dioctylfluorenyl-2,7-diyl-co(4,4'-(N-4-butylphenyl)diphenylamine], a poly((9,9- dioctylfluorene)-co-N,N-diphenyl-N,N-di-(p-butylphenyl)-1,4-diaminobenzene), NiO, MoO$_3$, or a combination thereof.

18. The electroluminescent device of claim 1, wherein the electroluminescent device further comprises a hole injection layer disposed between the first electrode and the hole transport layer.

19. A display device comprising the electroluminescent device of claim 1.

* * * * *